(12) United States Patent
Shose et al.

(10) Patent No.: US 7,625,666 B2
(45) Date of Patent: Dec. 1, 2009

(54) LEAD PLATE-ATTACHED COIN-TYPE BATTERY WHOSE LEAD PLATE IS ATTACHED TO EXCLUSIVELY EITHER AN OUTER CAN OR A CAP

(75) Inventors: Tomoyuki Shose, Moriguchi (JP);
Katsuyuki Kida, Moriguchi (JP);
Masao Kondou, Moriguchi (JP); Yasuo Akai, Moriguchi (JP)

(73) Assignees: Sanyo Electric Co. Ltd., Moriguchi-shi (JP); Sanyo Energy Tottori Co., Ltd., Moriguchi-shi (JP)

( * ) Notice: Subject to any disclaimer, the term of this patent is extended or adjusted under 35 U.S.C. 154(b) by 160 days.

(21) Appl. No.: 11/905,282

(22) Filed: Sep. 28, 2007

(65) Prior Publication Data

US 2008/0081253 A1    Apr. 3, 2008

(30) Foreign Application Priority Data

Sep. 28, 2006    (JP)    ............................. 2006-265041

(51) Int. Cl.
*H01M 2/02* (2006.01)
(52) U.S. Cl. .................. 429/162; 429/163; 429/164; 429/176; 228/901
(58) Field of Classification Search .................. None
See application file for complete search history.

(56) References Cited

U.S. PATENT DOCUMENTS 6,676,440 B1 *    1/2004    Inamine et al. ............. 439/500

FOREIGN PATENT DOCUMENTS

JP        2002-298804 A    10/2002
WO    WO 2007/069690 A1    6/2007

OTHER PUBLICATIONS

Goyal et al., Journal of Micromechanics and Microengineering 14, p. 819-825, Apr. 2004.*

Toleno et al., "Adhesives, Underfills, and Coatings in Electronic Assemblies," Electronic Materials and Processes Handbook 3rd ed., p. 9.28, McGraw Hill, Aug. 2003.*

* cited by examiner

*Primary Examiner*—Melvin C Mayes
*Assistant Examiner*—James Corno
(74) *Attorney, Agent, or Firm*—Westerman, Hattori, Daniels & Adrian, LLP

(57) ABSTRACT

A lead plate-attached coin-type battery is constituted from a combination of a coin-type battery and a positive lead plate. In the coin-type battery, a negative cap seals the aperture of a positive outer can. In a lateral view, the positive lead plate is crank-shaped, and one end thereof is attached to the outer surface of the positive outer can of the coin-type battery. A lead plate is not attached to the negative cap. One or more projections that project in the Z axis direction are provided on the negative cap. In the lead plate-attached coin-type battery, the positive lead plate and negative cap have been attached to respective conductive lands on a circuit board by a solder reflow method.

10 Claims, 6 Drawing Sheets

LEAD PLATE-ATTACHED COIN-TYPE BATTERY WHOSE LEAD PLATE IS ATTACHED TO EXCLUSIVELY EITHER AN OUTER CAN OR A CAP

BACKGROUND OF THE INVENTION

1. Field of the Invention

The present invention relates to a lead plate-attached coin-type battery whose lead plate is attached to exclusively either an outer can or a cap that covers an aperture of the outer can.

2. Description of the Related Art

Lithium secondary batteries are small, lightweight, and have a high energy density as well as superior storage characteristics (self-discharge characteristics). For these reasons, lithium secondary batteries have conventionally been widely used as a main power source or backup power source in various electronic devices. The lithium secondary batteries incorporated in such devices are coin-type, cylindrical-type, or the like, and mounting is widely performed by direct mounting to a printed board or the like.

The method for mounting a lithium secondary battery to a circuit board involves, for example, attaching one end of a lead plate (made of metal) to an external terminal face of the lithium secondary battery by spot welding, laser welding, or the like, inserting the other end of the lead plate into the terminal hole provided in the circuit board, placing and holding the lithium secondary battery onto a conductive land of the circuit board, and performing attachment by soldering.

The so-called solder reflow method is used to inexpensively mount electronic components to the circuit board. The solder reflow method involves applying cream solder to the conductive land of the circuit board, placing an electronic component on the face of the conductive land to which the cream solder has been applied, and then passing the entire circuit board through a reflow oven to perform heating thereof, thereby melting the cream solder and mounting the electronic component to the circuit board. Automatic soldering technology using the solder reflow method is also applied to the mounting of lithium secondary batteries to circuit boards.

When mounting the lithium secondary battery to the circuit board by the solder reflow method, the cream solder is melted by heating in a reflow oven at a high temperature of 230[° C.] to 270[° C.] for a short period of time. For example, when mounting a coin-type battery to a circuit board, first a positive lead plate is attached to the outer can, which is the positive terminal, and a negative lead plate is attached to the negative cap, which is the negative terminal. Next, the coin-type battery is mounted to the circuit board by soldering the positive lead plate and negative lead plate onto conductive lands on the circuit board by the above-described solder reflow method.

In recent years, in order to reduce the space occupied by mounting a coin-type battery to a circuit board, there has been proposed a method of omitting either the positive lead plate or negative lead plate, and directly soldering either the outer can or negative cap, whichever lacks a lead plate, to the conductive land of the circuit board (Japanese Patent Application Publication No. 2002-298804).

In the mounting method proposed in the aforementioned document, one of the lead plates is omitted when mounting the coin-type battery to the circuit board, thereby enabling reducing the mounted height of the coin-type-battery on the circuit board by the thickness of the omitted lead plate, which is not possible when lead plates are attached to both the outer can and the negative cap in mounting. Therefore, when using the method proposed in the aforementioned document, it is possible to reduce the space occupied by the coin-type battery on the circuit board or increase the thickness of the coin-type battery by the thickness of a lead plate. If the thickness of the coin-type battery is increased, a higher capacity coin-type battery can be mounted in the same amount of occupied space.

However, when using the mounting method proposed in the aforementioned document, there are cases in which the strength of the bond between the coin-type battery and the conductive land on the circuit board is insufficient, and detachment can occur in the bonded portion by vibrations to the circuit board on which the coin-type battery has been mounted. Also, there are cases in which cream solder that has melted during reflowing flows out beyond the conductive lands, thereby causing short circuits with the other pole of the coin-type battery and other conductive lands on the circuit board.

SUMMARY OF THE INVENTION

The present invention has been achieved in order to solve the above problems, and an aim thereof is to provide a lead plate-attached coin-type battery that enables reducing the occupied area on the circuit board by soldering an outer can or a cap to a conductive land without a lead therebetween, while having a highly-strong bond to the conductive land and reducing external short circuits.

A lead plate-attached coin-type battery of the present invention includes an outer can, a cap, an electrode assembly, and a lead plate as main constituent elements. The outer can is made of a conductive material such as a metal, and is shallow pan-shaped. The cap is made of a conductive material such as a metal, and seals an aperture of the outer can via an insulation member. The electrode assembly includes a positive element and a negative element disposed in opposition via a separator, and is stored in an internal space enclosed by the outer can and the cap. One of the positive element and the negative element is electrically connected to the outer can, and the other one of the positive element and the negative element is electrically connected to the cap. The lead plate is mechanically and electrically attached to one of the outer can and the cap.

In the lead plate-attached coin-type battery of the present invention, an outer face of one of the outer can and the cap to which the lead plate is not attached has formed thereon one or more projections that project away from the internal space (the space in which the electrode assembly is stored).

In mounting the lead plate-attached coin-type battery pertaining to the present invention to a circuit board, the one or more projections provided on the outer face of either the outer can or the cap (the one to which the lead plate is not attached), and the face on which the projections are provided is soldered directly to the conductive land of the circuit board without a lead plate therebetween. The lead plate-attached coin-type battery pertaining to the present invention therefore enables reducing the space occupied by the lead plate-attached coin-type battery on the circuit board after mounting to a smaller size than in conventional technology in which lead plates are attached to both the outer can and cap, and the lead plates are soldered to conductive lands on the circuit board.

Also, in the lead plate-attached coin-type battery pertaining to the present invention, forming the one or more projections on the outer face of either the outer can or the cap increases the bond area with the solder layer on the conductive land over a case in which projections have not been provided. The lead plate-attached coin-type battery pertaining to the present invention therefore enables mounting to the circuit board with a high bond strength.

Also, the one or more projections, which are provided on the outer face of either the outer can or cap that is to be soldered directly to the conductive land, have the effect of suppressing the outflow of solder that has melted during reflowing. Specifically, recessions are formed as a result of the formation of the projections, and these recessions function as reservoir spaces for the solder that has melted during reflowing. The lead plate-attached coin-type battery pertaining to the present invention therefore enables preventing the outflow of solder that has melted during reflowing, and preventing the occurrence of external short circuits. Note that in consideration of the function of a recession to suppress the outflow of solder that has melted during reflowing, the reservoir effect is enhanced by providing a plurality of the projections.

Therefore, according to the lead plate-attached coin-type battery pertaining to the present invention, the bond strength of the soldering to the circuit board can be increased, and furthermore, highly reliable soldering can be achieved, even when one lead plate is omitted and the overall height of the coin-type battery is increased by the thickness of the omitted lead plate to raise the battery. capacity.

Variations such as the following are also applicable in the lead plate-attached coin-type battery pertaining to the present invention.

In the lead plate-attached coin-type battery pertaining to the present invention, an inner face of the one of the outer can and the cap to which the lead plate is not attached (the one that has the projections formed on the outer face) can be flat, but preferably has formed thereon a recession that recedes away from the internal space.

According to the above structure, the recession (e.g., a dimple or groove) formed in the inner face functions as a reservoir space for gas produced in the storage space by the heat applied during reflowing. Note that the gas is produced when the electrolyte vaporizes due to the heat applied during reflowing. Also, the formation of the recession raises the local mechanical strength and enables suppressing swelling of the coin-type battery due to the heat applied during reflowing.

Also, in the lead plate-attached coin-type battery pertaining to the present invention, the one or more projections on the outer face and the recession in the inner face may have been formed by embossing processing. This structure enables forming the projections on the outer face and the recession in the inner face in the same step, and has high formability. This structure therefore enables reducing manufacturing cost.

In the lead plate-attached coin-type battery pertaining to the present invention, a projecting height of the one or more projections may be greater than or equal to 25[%] of a plate thickness (of the outer can or the cap) in a formation area of the one or more projections, which is preferable in consideration of ensuring battery capacity, bond strength, and suppressing the outflow of melted solder during reflowing. Note that, if the projections are too high, the total thickness of the lead plate-attached coin-type battery becomes too large, which is not preferable in consideration of energy efficiency. It is therefore preferable for the height of the projections to be less than the thickness of the lead plate.

In the lead plate-attached coin-type battery pertaining to the present invention, the one or more projections may have been formed in a central area that, in a planar view of the one of the outer can and the cap to which the lead plate is not attached, occupies less than or equal to 85% of an entire visible surface area, which is practical due to increasing the bond strength and suppressing the outflow of melted solder during reflowing. In coin-type batteries, the outer edge portions of the outer can and cap have been rounded by R (Round) processing and the central areas are flat. It is preferable for the projections to be formed on the flat area in the present invention. This is because forming projections on the rounded outer edge portion reduces the ability to suppress the outflow of melted solder.

Also, it is preferable for a plurality of projections to be formed, in consideration of stability during solder reflowing, strength, and electrical connectivity. Also, it is preferable for the outer face of the one of the outer can and the cap to which the lead plate is not attached to have formed thereon a plurality of the projections that project away from the internal space, and preferable for each of the projections to have been formed so as to occupy 0.01 mm$^2$. Here, care should be taken such that the occupied area per projection is not too small, which would result in the insufficient formation of recessions on the inner side of the battery.

In the lead plate-attached coin-type battery pertaining to the present invention, the outer face of the one of the outer can and the cap to which the lead plate is not attached may have formed thereon a plurality of the projections that are dot-shaped, or have been arranged in a lattice pattern.

Also, in the lead plate-attached coin-type battery pertaining to the present invention, the one or more projections may have been formed so as to, in a planar view of the one of the outer can and the cap to which the lead plate is not attached, extend in a radiating pattern from a central point of a formation area of the one or more projections.

Also, in the lead plate-attached coin-type battery pertaining to the present invention, the one or more projections may have been formed so as to, in a planar view of the one of the outer can and the cap to which the lead plate is -not attached, be embankment-shaped having a portion missing and surround a formation area of the one or more projections. This enables effectively suppressing the outflow of solder that has melted during reflowing. Specifically, for example, the one or more projections may have been formed so as to, in a planar view of the one of the outer can and the cap to which the lead plate is not attached, be in a concentric circle pattern centered on a central point of a formation area of the one or more projections.

BRIEF DESCRIPTION OF THE DRAWINGS

These and other objects, advantages, and features of the invention will become apparent from the following description thereof taken in conjunction with the accompanying drawings, which illustrate a specific embodiment of the present invention.

In the drawings.

DESCRIPTION OF THE PREFERRED EMBODIMENTS

A preferred embodiment of the present invention is described below with reference to the drawings. Note that the concrete examples below are merely examples used to provide an easily understandable description of the structure of the present invention and the effects and advantages achieved thereby. Portions of the present invention other than the characteristic features of the structure should not be limited in any way to the examples described below.

Embodiment

1. Structure of Lead Plate-attached Coin-type Battery 1

Figure 1A:
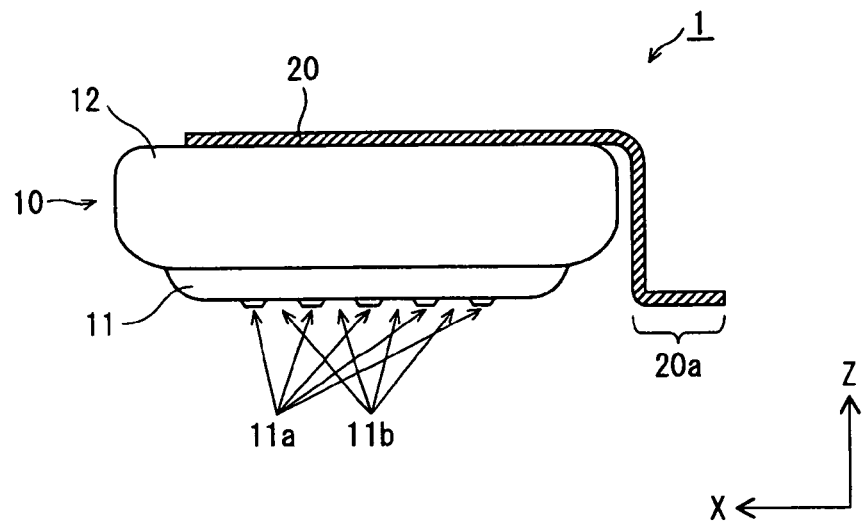
FIG. 1A is a lateral view showing a structure of a lead plate-attached coin-type battery 1 pertaining to the embodiment.

The following describes the structure of a lead plate-attached coin-type battery 1 pertaining to the present embodiment with reference to FIG. 1A.

As shown in FIG. 1A, the lead plate-attached coin-type battery 1 pertaining to the present embodiment includes a coin-type battery 10, appositive outer can 12, and a positive lead plate 20 that is attached to the positive outer can 12. The coin-type battery 10 is a flat-type lithium secondary battery whose thickness in the Z axis is small. The positive lead plate 20 has been attached, by spot welding (resistance welding), laser welding or the like, to the top main face of the positive outer can 12 positioned on the top side of the coin-type battery 10 in the Z axis.

A negative cap 11 of the coin-type battery 10 has been arranged so as to plug an aperture of the positive outer can 12. Note that an insulation gasket 13 (not depicted in FIG. 1A), has been inserted between the positive outer can 12 and the negative cap 11, which are thereby insulated from each other. The package of the coin-type battery 10 is formed by the positive outer can 12 and the negative cap 11, and a storage space for an electrode assembly 14 (not depicted in FIG. 1A) is hermetically sealed therein.

As shown in FIG. 1A, dot-shaped projections 11a (hereinafter, called "outer projections") have been formed in a distributed state on the bottom main face of the negative cap 11 in the Z axis, and as a result, recessions 11b (hereinafter, called "outer recessions") exist between the outer projections 11a. In other words, the main face of the negative cap 11 has been made uneven.

The positive lead plate 20 is composed of a reed-shaped flat plate made of, for example, a stainless material, and has been bent into a crank shape in the X-Z plane. Note that in the lead plate-attached coin-type battery 1 of the present embodiment, the positive lead plate 20 has been processed such that an end portion 20a thereof is at substantially the same level as the main face of the negative cap 11 in the Z axis, and is substantially parallel to the X axis.

2. Structure of Coin-type Battery 10

Figure 1B:
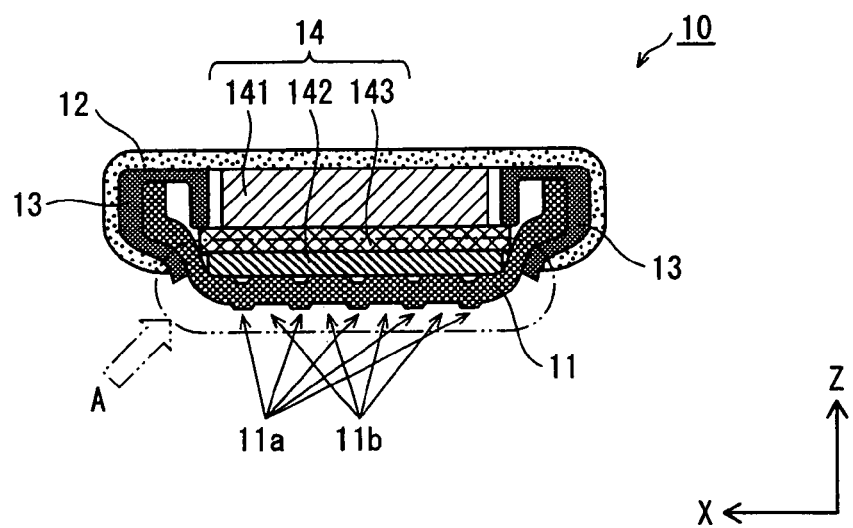
FIG. 1B is a cross-sectional view showing a structure of a coin-type battery 10.

The following describes the structure of the coin-type battery 10 with reference to FIG. 1B.

As described above, the package of the coin-type battery 10 is constituted from the shallow pan-shaped positive outer can 12, which is made of a stainless material, and the negative cap 11 that is made of the same stainless material. Specifically, as shown in FIG. 1B, the positive outer can 12 and negative cap 11 constitute a battery container, and the electrode assembly 14 is stored in the space therein. Also, the positive outer can 12 and negative cap 11 are insulated from each other by the insulation gasket 13, and the internal space has been hermetically sealed by caulking processing.

The electrode assembly 14 is constituted from a cathode active material pellet 141 and an anode active material 142 that are disposed in opposition and sandwich a separator 143 therebetween. The cathode active material pellet 141 includes, for example, manganese dioxide as a main constituent, and the anode active material 142 is, for example, a disk-shaped lithium anode.

Note that in addition to including the electrode assembly 14, the internal space enclosed by the positive outer can 12 and negative cap 11 has been filled with an electrolyte (not depicted). The electrolyte is., for example, a 1:1 mixed solvent of propylene carbonate (PC) and dimethoxyethane (DME) as a nonaqueous solvent, into which a concentration of 1 [mol/L] of lithium trifluoromethanesulfonate ($LiCF_3SO_3$) as an electrolyte has been dissolved.

Also, with respect to size, the coin-type battery 10 of the present embodiment has, for example, a diameter of 4.8 [mm] and a thickness of 1.5 [mm].

3. Projections 11a and Recessions 11b of Negative Cap 11

As described above, in the coin-type battery 10 of the present embodiment, the main face of the negative cap 11 has been processed so as to have projections and recessions, which are described below with reference to FIG. 2A and FIG. 2B.

Figure 2A:
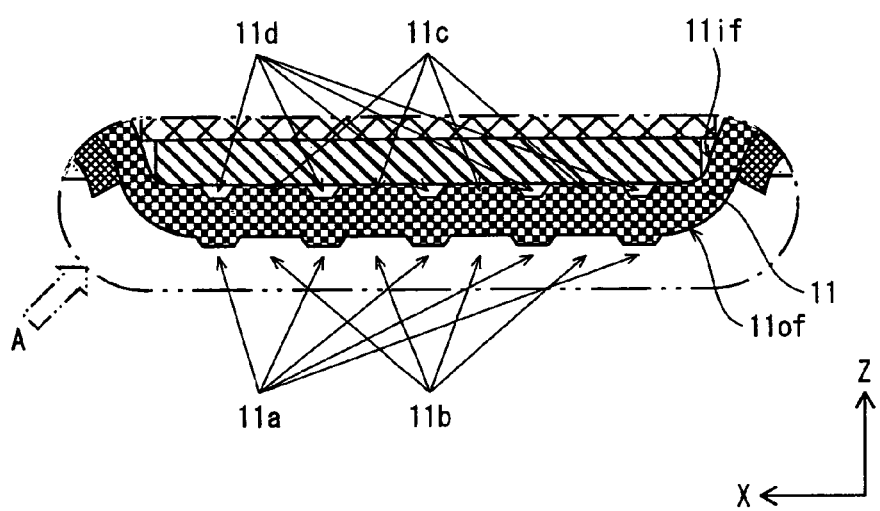
FIG. 2A is a cross-sectional view showing the shape of a negative cap 11 of the coin-type battery 10 enlarged from a portion A of FIG. 1B that is encircled by the two-dot chain line.

As shown in FIG. 2A, the outer main face of the negative cap 11 is uneven due to the outer projections 11a and outer recessions 11b. Also, projections 11c (hereinafter, called "inner projections") and recessions 11d (hereinafter, called "inner recessions") have been formed on the inner main face of the negative cap 11.

The outer projections 11a and outer recessions 11b on the outer main face 11of of the negative cap 11, and the inner projections 11c and inner recessions 11d on the inner main face 11if of the negative cap 11 have been formed simultaneously in respective front-back relationships by double-sided embossing.

Figure 2B:
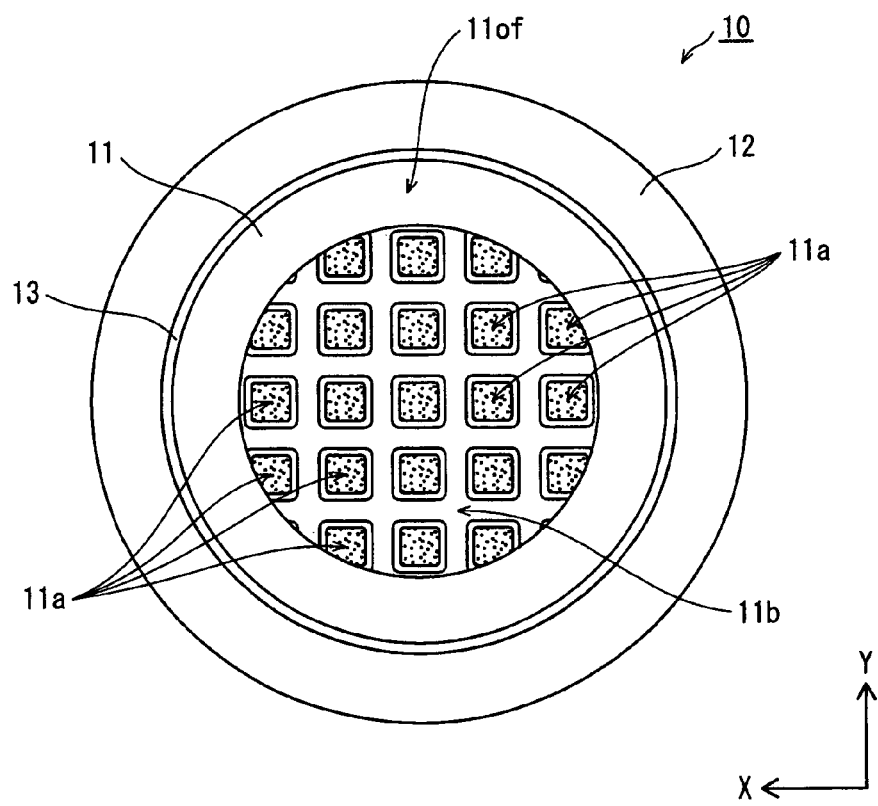
FIG. 2B is a plan view showing the shape of the negative cap 11 of the coin-type battery 10.

As shown in FIG. 2B, viewing the outer main face 11of of the negative cap 11 from above shows that the outer projections 11a have been formed on the entirety of the circular outer main face 11of in a lattice pattern (e.g., 40 mesh). Also, each outer projection 11a is substantially square in shape with rounded corners. Note that the length of a side of the outer projections 11a is, for example, 0.05 [mm], and the pitch of the outer projections 11a is, for example, 0.5 [mm].

The outer projections 11a have a height of, for example, 0.1 [mm], and the width of a projection 13 (the leading edge width of the projection 13) is 0.05 [mm]. Also, the outer projections 11a on the negative cap 11 have been formed on a central area that occupies 85[%] of the entire visible surface area of the negative cap 11, and furthermore, each projection occupies 0.01 [$mm^2$] of the central area. Note that in normal coin-type batteries, the outer edge portion of the negative cap 11 has been rounded by R processing (corner-rounding processing), and a central area occupying 85[%] of the entire visible surface area is flat. In the present embodiment, the outer projections 11a are formed in the central area.

4. Mounting of Lead Plate-attached Coin-type Battery 1 to Circuit Board 50

Figure 3A:
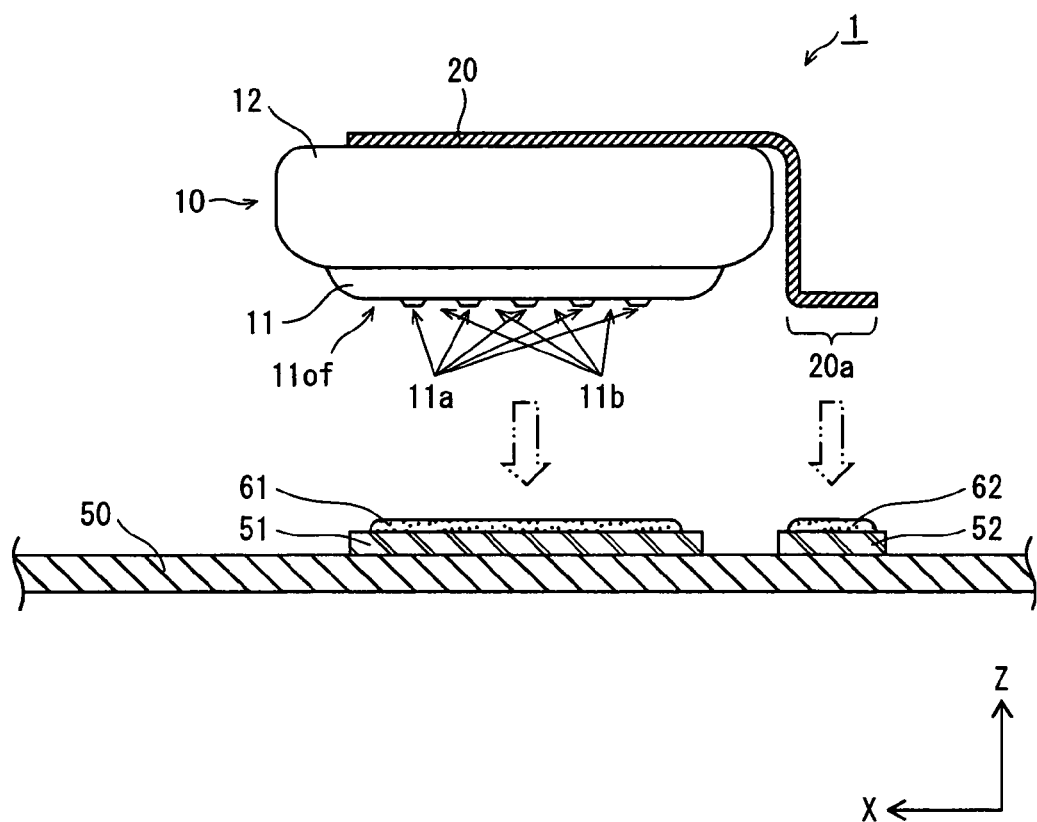
FIG. 3A shows a step for mounting the lead plate-attached coin-type battery 1, to a circuit board 50.
Figure 3B:
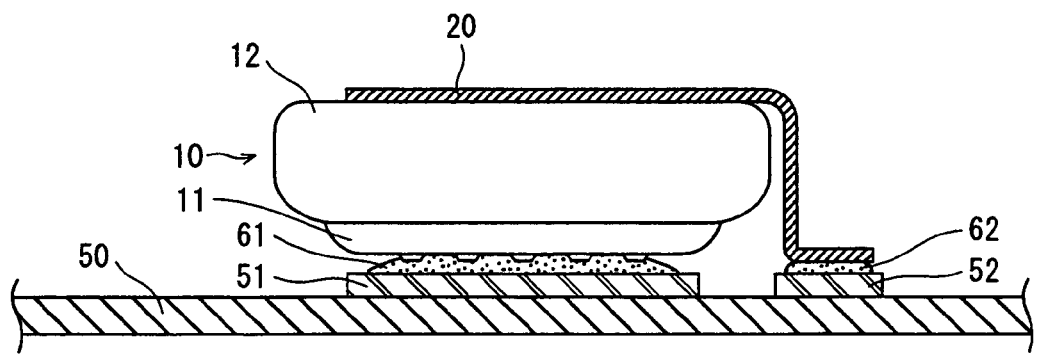
FIG. 3B is a lateral view (a partial cross-sectional view) showing the lead plate-attached coin-type battery 1 after mounting to the circuit board 50.

The following describes the mounting of the lead plate-attached coin-type battery 1 to the circuit board 50 with reference to FIG. 3A and FIG. 3B. Note that FIG. 3A schematically shows only the area on the circuit board 50 where the lead plate-attached coin-type battery 1 is to be mounted, and other areas are not depicted.

As shown in FIG. 3A, two conductive lands 51 and 52 have been formed on the top main face of the circuit board 50 in the Z axis. In actuality the two conductive lands 51 and 52 are connected to other conductive lands etc. on the circuit board 50 by pattern wiring (not depicted) The two conductive lands 51 and 52 have been formed at positions that correspond respectively to the negative cap 11 and the end portion 20a of the positive lead plate 20.

As shown in FIG. 3A, cream solder layers 61 and 62 have been applied to the top main faces of the conductive lands 51 and 52 in the Z axis. The negative cap 11 and positive lead plate 20 of the lead plate-attached coin-type battery 1 are brought into contact with and pushed somewhat into the cream solder layers 61 and 62 on the conductive lands 51 and 52 respectively.

Next, the circuit board 50 with the lead plate-attached coin-type battery 1 placed and held thereon is inserted into a reflow oven and heated for a short time at a temperature of, for example, 230[° C.] to 270[° C.] The heat in the reflow oven melts the cream solder layers 61 and 62. Thereafter, the circuit board 50 is taken out of the reflow oven and cooled. This completes the mounting of the lead plate-attached coin-type battery 1 to the circuit board 50 as shown in FIG. 3B.

5. Advantages of the Lead Plate-attached Coin-type Battery 1

In the lead plate-attached coin-type battery 1 of the present embodiment, the formation of the outer projections 11a and outer recessions 11b on the outer main face 11of of the negative cap 11 increases the contact area between the cream solder layers 61 and 62 and the outer main face 11of of the negative cap 11 over a case in which the outer main face does not have projections and recessions, and obtains a high bond strength in mounting to the circuit board 50. Also, in the lead plate-attached coin-type battery 1, the positive lead plate 20 is attached to only the positive outer can 12, and the negative cap 11 is soldered directly to conductive land 51 without attaching a lead plate to the negative cap 11, thereby reducing the space occupied by the lead plate-attached coin-type battery 1 after mounting to the circuit board 50 (i.e., reducing the mounted height), unlike a case in which a lead plate is attached to the negative cap as well.

Also, in the lead plate-attached coin-type battery 1, the outer projections 11a that have been formed on the outer main face 11of of the negative cap 11 serve as embankments that suppress the outflow of melted solder during reflowing, and the outer recessions 11b function as reservoir spaces for the melted solder. The lead plate-attached coin-type battery 1 therefore prevents the outflow of melted solder during reflowing, thereby preventing the occurrence of external short circuits with other electrical components and conductive lands.

Also, in the lead plate-attached coin-type battery 1 of the present embodiment, the inner projections 11c and inner recessions 11d have been formed on the inner main face 11if of the negative cap 11. As such, the inner recessions 11d function as reservoir spaces for gas produced in the storage space by heating during reflowing. Also, the formation of the inner projections 11c and inner recessions 11d on the inner main face 11if of the negative cap 11 increases the local mechanical strength and enables suppressing swelling of the coin-type battery due to heat during reflowing.

Also, in the lead plate-attached coin-type battery 1, the outer projections 11a and outer recessions 11b and the inner projections 11c and inner recessions 11d have been integrally formed by embossing processing. As such, in the lead plate-attached coin-type battery 1, the outer projections 11a and outer recessions 11b and the inner projections 11c and inner recessions 11d can be formed in the same step, have high formability, and can realize low manufacturing cost.

Note that the projecting height of the outer projections 11a is preferably 25[%] or more of the plate thickness of the negative cap 11 (which is, for example, 0.05 [mm]), in consideration of bond strength and suppressing the outflow of melted solder during reflowing. Note that if the projections are too high, the total thickness of the lead plate-attached coin-type battery becomes too large, which is not preferable in consideration of energy efficiency. It is therefore preferable for the height of the projections to be less than the thickness of the lead plate that is attached to a conventional cap.

Also, each of the outer projections 11a preferably occupies (i.e., has a formation density of) 0.01 [mm$^2$] or more with respect to the outer main face 11of of the negative cap 11, in consideration of improving bond strength and suppressing the outflow of melted solder during reflowing.

Modification 1

Figure 4A:
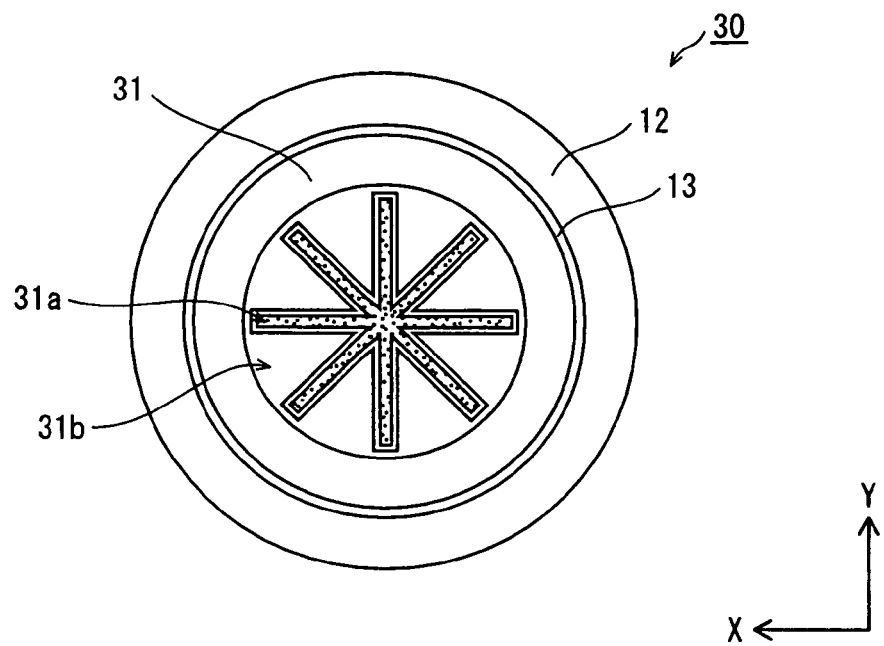
FIG. 4A is a plan view showing the shape of a negative cap 31 of a coin-type battery 30 pertaining to modification 1.

The following describes the structure of a lead plate-attached coin-type battery of modification 1 with reference to FIG. 4A. Note that the lead plate-attached coin-type battery of modification 1 differs from the above embodiment with respect to the configuration of the outer main face of a negative cap 31 of a coin-type battery 30. Therefore only the coin-type battery 30 is shown in FIG. 4A.

As shown in FIG. 4A, in the coin-type battery 30 of modification 1, eight linear outer projections 31a have been formed on the outer main face of the negative cap 31 so as to extend in a radial pattern from a center portion of the outer main face. Also, outer recessions 31b are provided between the outer projections 31a.

Note that in the present modification as well, the outer projections 31a and outer recessions 31b on the negative cap 31 have been formed by embossing processing, and similarly to the negative cap 11 of the above embodiment, the inner main face of the negative cap 31 has been processed so as to be uneven (not depicted).

The lead plate-attached coin-type battery of the present modification has the same advantages as the lead plate-attached coin-type battery 1 of the above embodiment.

Modification 2

Figure 4B:
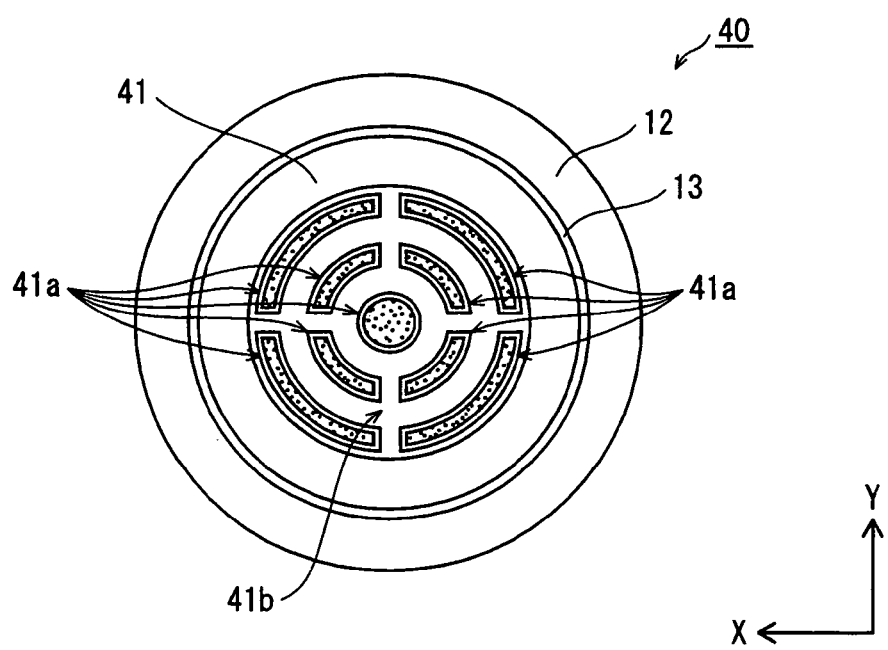
FIG. 4B is a plan view showing the shape of a negative cap 41 of a coin-type battery 40 pertaining to modification 2.

The following describes the structure of a lead plate-attached coin-type battery of modification 2 with reference to FIG. 4B. Note that the lead plate-attached coin-type battery of modification 2 also differs from the above embodiment with respect to the configuration of the outer main face of a negative cap 41 of a coin-type battery 40. Therefore only the coin-type battery 40 is shown in FIG. 4B.

As shown in FIG. 4B, in the coin-type battery 40 of modification 2, outer projections 41a have been formed on the outer main face of the negative cap 41 in concentric circles around a center portion of the outer main face. Also, outer recessions 41b are provided between the outer projections 41a. Here, in the lead plate-attached coin-type battery of modification 2, forming four of the outer projections 41a at the outer edge of the negative cap 41 is advantageous since these four outer projections 41a suppress the outflow of melted solder during reflowing.

Also, the outer recessions 41b have been formed between the four outer projections 41a at the outer edge, thereby suppressing air from being trapped between the solder layer and the negative cap 41 during reflowing.

Note that in the present modification as well, the outer projections 41a and outer recessions 41b on the negative cap 41 have been formed by embossing processing, and similarly to the negative cap 11 of the above embodiment, the inner main face of the negative cap 41 has been processed so as to be uneven (not depicted).

The lead plate-attached coin-type battery of the present modification also has the same advantages as the lead plate-attached coin-type battery 1 of the above embodiment.

Evaluation Test

The following describes results from an evaluation test performed to confirm the advantages of the lead plate-attached coin-type battery 1 of the above embodiment.

1. Working Example

The lead plate-attached coin-type battery 1 of the above embodiment was used as the lead plate-attached coin-type battery of the working example.

2. Comparative Example 1

The structure of a lead plate-attached coin-type battery 7 of comparative example 1 is described below with reference to FIG. 5A and FIG. 5B.

Figure 5A:
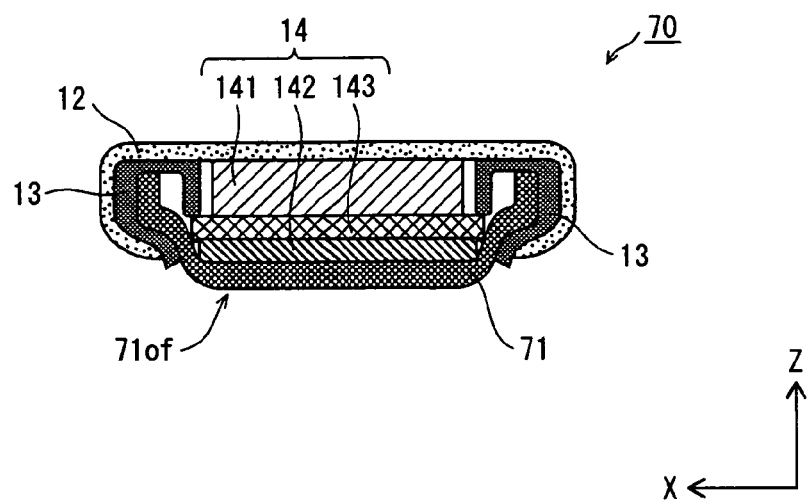
FIG. 5A is a cross-sectional view showing the structure of a coin-type battery 70 pertaining to comparative example 1.

As shown in FIG. 5A, in a coin-type battery 70 of the lead plate-attached coin-type battery 7 pertaining to comparative example 1, an outer main face 71of of a negative cap 71 is substantially flat. In other words, in the coin-type battery 70 of comparative example 1, the outer main face 71of of the negative cap 71 has not been processed so as to be uneven. Other portions of the structure are no different from the lead plate-attached coin-type battery 1 of the working example.

Figure 5B:
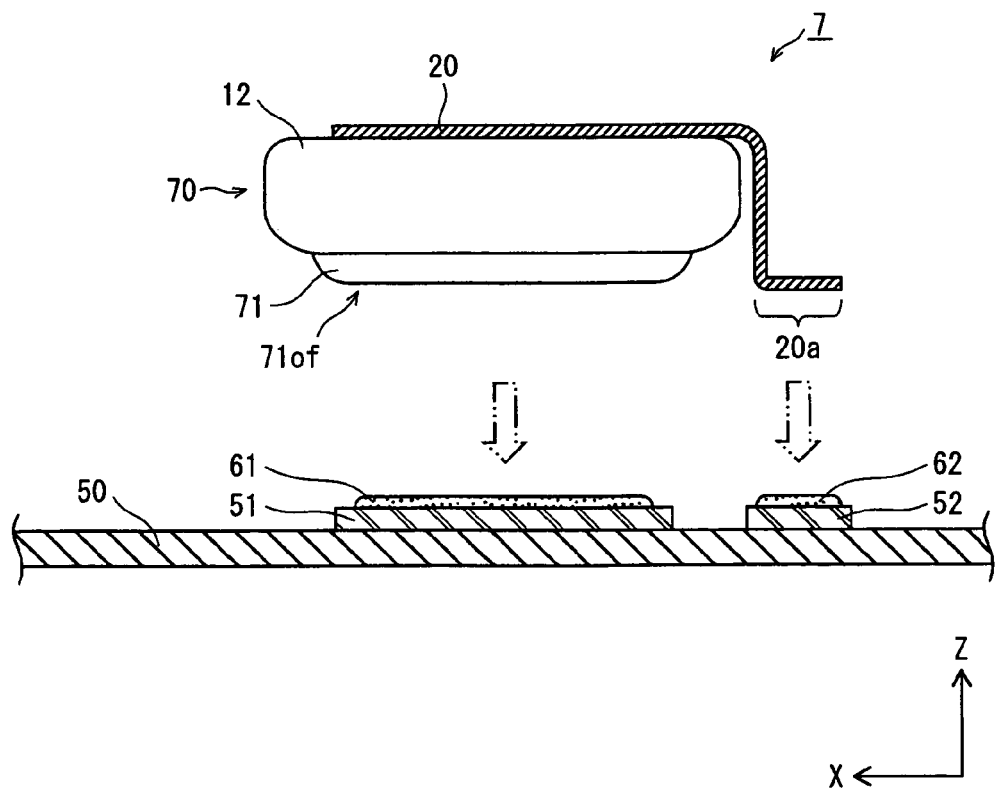
FIG. 5B shows a step for mounting a coin-type battery 7 having a lead plate attached, pertaining to comparative example 1, to the circuit board 50.

As shown in FIG. 5B, the lead plate-attached coin-type battery 7 of comparative example 1 is placed and held on the conductive lands 51 and 52 on which the cream solder layers 61 and 62 have been pre-applied, and the entire circuit board is inserted into a reflow oven to perform solder reflowing. The reflow temperature etc. is the same as in the above embodiment.

3. Comparative Example 2

The structure of a lead plate-attached coin-type battery 8 of comparative example 2 is described below with reference to FIG. 6A and FIG. 6B.

Figure 6A:
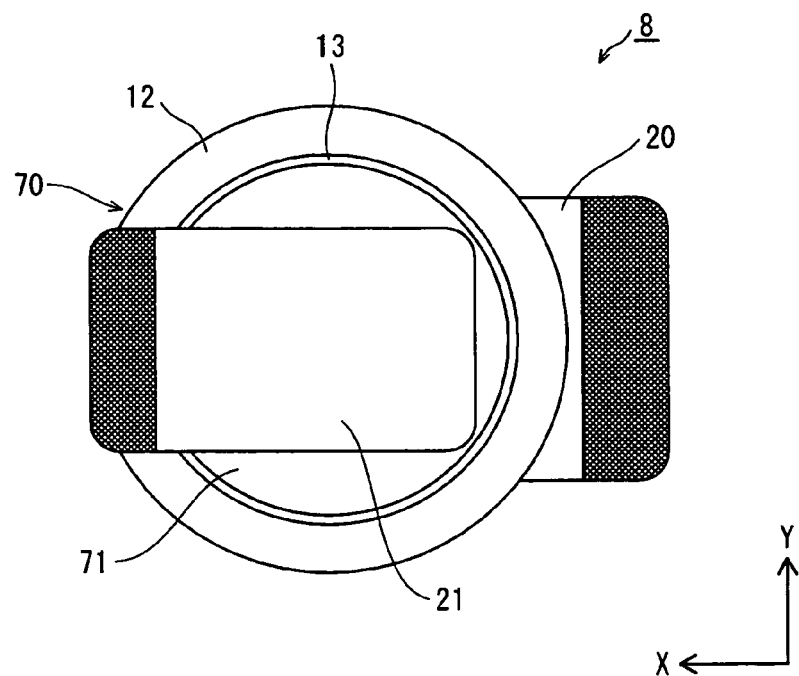
FIG. 6A is a plan view showing a structure of a lead plate-attached coin-type battery 8 pertaining to comparative example 2.

As shown in FIG. 6A, the lead plate-attached coin-type battery 8 of comparative example 2 includes the coin-type battery 70 of comparative example 1. Also, the positive lead plate 20 has been attached to the positive outer can 12, and a negative lead plate 21 has been attached to the negative cap 71. In other words, in the lead plate-attached coin-type battery 8 of comparative example 2, the lead plates 20 and 21 have been attached to the positive outer can 12 and the negative cap 71 respectively.

Figure 6B:
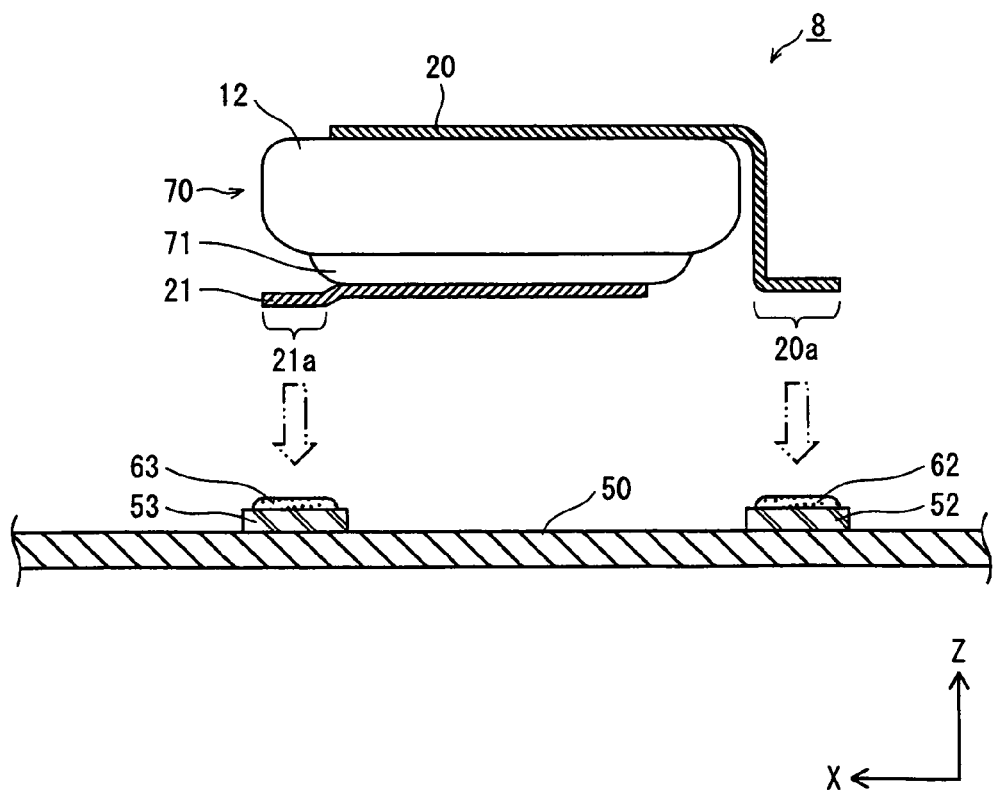
FIG. 6B shows a step for mounting the lead plate-attached coin-type battery 8 pertaining to comparative example 2 to the circuit board 50.

As shown in FIG. 6B, in the mounting of the lead plate-attached coin-type battery 8 of comparative example 2 to the circuit board 50, two conductive lands 53 and 52 are formed on the top main face of the circuit board 50 in the Z axis. The two conductive lands 53 and 52 are formed in positions that correspond respectively to end portions 20a and 21a of the lead plates 20 and 21.

The lead plate-attached coin-type battery 8 is placed and held on the conductive lands 53 and 52 on which cream solder layers 63 and 62 respectively have been formed in advance, and the entire circuit board is inserted into a reflow oven, thereby completing the mounting. Note that this is the same as in comparative example 1, with the exception that the negative lead plate 21 has been attached to the negative cap 71.

However, in the lead plate-attached coin-type battery 8 of comparative example 2, due to attaching the negative lead plate 21 to the negative cap 71, the overall height of the coin-type battery 70 was made 1.4 [mm], which is lower than the coin-type batteries of the working example and comparative example 1. For this reason, there is a reduction in the battery capacity that is commensurate with the amount by which the lead plate-attached coin-type battery 8 of comparative example 2 is thinner than the lead plate-attached coin-type batteries of the working example and comparative example 1.

4. Evaluation Test 4-1. Cycle Lifetime Test

A battery test was performed to find out the cycle lifetimes of the lead plate-attached coin-type batteries 1, 7 and 8 of the working example, comparative example 1 and comparative example 2, which were manufactured as described above. The test conditions were as follows.

Charge/discharge rate: 0.02 [mA]

Minimum battery capacity: 0.05 [mAh]

Charge-discharge cycles were performed, and the lifetime of the battery was considered to be the number of cycles at which the battery capacity fell to 0.05 [mAh].

The results of the cycle lifetime test are shown in Table 1 as values that are relative to the cycle lifetime of comparative example 2, which has been set as "100".

4-2. Measuring Amount of Swelling of Coin-type Batteries

The amount of swelling was measured during mounting of the lead plate-attached coin-type batteries to the circuit board 50 by the solder reflow method. Note that the swelling of the coin-type batteries is due to gas produced by the vaporization etc. of the electrolyte in the coin-type batteries as a result of heating during reflowing.

Note that the results of measuring the amount of swelling are shown in Table 1 as values that are relative to the cycle lifetime of comparative example 2, which has been set as "100".

4-3. Measuring Bond Strength Between Circuit Board 50 and Lead Plate-attached Coin-type Batteries The bond strength between the circuit board 50 and the lead plate-attached coin-type batteries of the working example, comparative example 1 and comparative example 2 was measured. The bond strength was obtained by measuring the force required to detach the lead plate-attached coin-type batteries that had been mounted to the circuit board 5.

The results of measuring the bond strength are shown in Table 1 as values that are relative to the cycle lifetime of comparative example 2, which has been set as "100".

4-4. Checking Whether External Short Circuits have Occurred

Whether external short circuits have occurred in the coin-type batteries of the working example, comparative example 1 and comparative example 2 after mounting to the circuit board 50 was checked. An external short circuit occurs due to the outflow of solder on a conductive land during solder-attachment by the solder reflow method.

TABLE 1

|  | Cycle lifetime | Amount of swelling | Bond strength | External short |
|---|---|---|---|---|
| Working example | 105 | 50 | 120 | NO |
| Comparative example 1 | 107 | 120 | 100 | YES |
| Comparative example 2 | 100 | 100 | 100 | NO |

As shown in Table 1, the cycle lifetimes of the lead plate-attached coin-type batteries 1 and 7 of the working example and comparative example 1 were longer than the lead plate-attached coin-type battery 8 of comparative example 2. In the lead plate-attached coin-type batteries 1 and 7 of the working example and comparative example 1, a negative lead plate was not attached to the negative caps 11 or 71, thereby realizing a higher battery capacity than the lead plate-attached coin-type battery 8 of comparative example 2. It is thought that this is why the lead plate-attached coin-type batteries 1 and 7 of the working example and comparative example 1 have superior cycle lifetime properties over the lead plate-attached coin-type battery 8 of comparative example 2.

Also, in terms of the amount of swelling, the coin-type batteries 70 of comparative examples 1 and 2 had a greater amount of swelling than the coin-type battery-10 of the working example. In particular, the coin-type battery 70 of comparative example 1 had 2.4 times the swelling of the coin-type battery 10 of the working example. These results are due to the following reason. In the coin-type battery 70 of comparative example 1, the outer main face of the planar-surfaced negative cap 71 has been soldered directly to the conductive lands 51 and 52 of the circuit board 50, and as a result, the heat applied during reflowing is conducted into the coin-type battery 70 and the electrolyte vaporizes, thereby causing the large amount of battery swelling.

In the coin-type battery 70 of comparative example 2, the negative lead plate 21 is connected to the negative cap 71, which makes it difficult for the heat applied during reflowing to be conducted into the coin-type battery 70 due to being dissipated by the negative lead plate 21.

In contrast, the amount of swelling in the coin-type battery 10 of the working example is very small. This is due to the following reason. The inner recessions lid have been formed on the inner main face 11*if* of the negative cap 11, and even if the electrolyte vaporizes due to the heat applied during reflowing being conducted into the coin-type battery 10, the gas that has been produced accumulates in the inner recessions 11*d*, which makes it difficult for battery swelling to occur. Another reason that the amount of swelling in the coin-type battery 10 of the working example is small is that embossing processing has been performed on the negative cap 11 to create projections and recessions, which gives the negative cap 11 a high mechanical strength.

Also, there is a higher bond strength between the lead plate-attached coin-type battery 1 of the working example and the conductive lands 51 and 52 of the circuit board than the lead plate-attached coin-type batteries of comparative examples 1 and 2. This is because the outer main face 11*of* of the negative cap 11 of the working example has been made uneven, which increases the bond area and improves the bond strength between the coin-type battery 10 and the conductive lands 51 and 52 of the circuit board 50.

Furthermore, as shown in Table 1, external short circuits did not occur in the lead plate-attached coin-type battery 1 of the working example or the lead plate-attached coin-type battery 8 of comparative example 2, whereas external short circuits occurred in the lead plate-attached coin-type battery 7 of comparative example 1. This is because in the lead plate-attached coin-type battery 1 of the working example, the outer projections 11*a* formed on the outer main face 11*of* of the negative cap 11 serve as embankments that prevent the outflow of solder during reflowing, and potentially outflowing solder is accumulated in the outer recessions 11*b*. The working example therefore suppresses the flowing of solder out of the conductive land 51 during reflowing, which prevents short circuits due to solder existing between the conductive land 51 and conductive land 52.

In the lead plate-attached coin-type battery 7 of comparative example 1, the outer main face of the planar-surfaced negative cap 71 has been soldered directly to the conductive land 51 of the circuit board 50. Solder therefore flows out of the conductive land 51 during reflowing, thereby causing an external short circuit between the conductive land 51 and conductive land 52.

In this way, a lead plate is not attached to the negative cap 11 of the lead plate-attached coin-type battery 1 of the working example, thereby enabling the thickness of the coin-type battery 10 to be commensurately increased, which makes it possible to have a larger battery capacity.

Also, in the lead plate-attached coin-type battery 1 of the working example, the outer projections 11*a* and outer recessions 11*b* have been formed on the outer main face 11*of* of the negative cap 11, thereby increasing the bond area with the solder and increasing the bond strength with the conductive land 51 of the circuit board 50.

Other Remarks

Although in the above embodiment 1 and modifications 1 and 2 the outer main face of the negative caps 11, 31 and 41 of the coin-type batteries 10, 30 and 40 has been made uneven, the present invention is not limited to this. The outer main face of the positive outer can 12 may be made uneven, and the negative lead plate may be attached to the negative caps 11, 31 and 41.

Also, although coin-type batteries having a flat cylindrical shape from an external view are used as examples in the above embodiment 1 and modifications 1 and 2, a coin-type battery of the present invention is not limited to having a flat cylindrical shape from an external view. A coin-type battery of the present invention may have a substantially rectangular shape.

Also, the numerical values and materials in the above embodiment 1 are examples, and can be changed appropriately.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A lead plate-attached coin-type battery comprising:
    an outer can that is made of a conductive material and is shallow pan-shaped;
    a cap that is made of a conductive material and seals an aperture of the outer can via an insulation member;
    an electrode assembly including a positive element and a negative element disposed in opposition via a separator, the electrode assembly being stored in an internal space enclosed by the outer can and the cap, one of the positive element and the negative element being electrically connected to the outer can, and an other one of the positive element and the negative element being electrically connected to the cap;
    a lead plate attached to one of the outer can and the cap, wherein
    an outer face of one of the outer can and the cap to which the lead plate is not attached has formed thereon one or more projections that project away from the internal space; and
    an inner face of the one of the outer can and the cap to which the lead plate is not attached has formed thereon a recession that recedes away from the internal space.

2. The lead plate-attached coin-type battery of claim 1, wherein the one or more projections on the outer face and the recession in the inner face have been formed by embossing processing.

3. The lead plate-attached coin-type battery of claim 1, wherein
a projecting height of the one or more projections is greater than or equal to 25% of a plate thickness in a formation area of the one or more projections.

4. The lead plate-attached coin-type battery of claim 1, wherein
the one or more projections have been formed in a central area that, in a planar view of the one of the outer can and the cap to which the lead plate is not attached, occupies less than or equal to 85% of an entire visible surface area.

5. The lead plate-attached coin-type battery of claim 1, wherein
the outer face of the one of the outer can and the cap to which the lead plate is not attached has formed thereon a plurality of the projections that project away from the internal space, and
each of the projections has been formed so as to occupy $0.01\ mm^2$.

6. The lead plate-attached coin-type battery of claim 1, wherein
the outer face of the one of the outer can and the cap to which the lead plate is not attached has formed thereon a plurality of the projections that project away from the internal space, and
each of the projections is dot-shaped.

7. The lead plate-attached coin-type battery of claim 1, wherein
the one or more projections have been formed so as to, in a planar view of the one of the outer can and the cap to which the lead plate is not attached, be arranged in a lattice pattern.

8. The lead plate-attached coin-type battery of claim 1, wherein
the one or more projections have been formed so as to, in a planar view of the one of the outer can and the cap to which the lead plate is not attached, extend in a radiating pattern from a central point of a formation area of the one or more projections.

9. The lead plate-attached coin-type battery of claim 1, wherein
the one or more projections have been formed so as to, in a planar view of the one of the outer can and the cap to which the lead plate is not attached, be embankment-shaped having a portion missing and surround a formation area of the one or more projections.

10. The lead plate-attached coin-type battery of claim 1, wherein
the one or more projections have been formed so as to, in a planar view of the one of the outer can and the cap to which the lead plate is not attached, be in a concentric circle pattern centered on a central point of a formation area of the one or more projections.

* * * * *